United States Patent [19]

Satoh

[11] Patent Number: 5,908,529
[45] Date of Patent: Jun. 1, 1999

[54] MULTI-LAYER FILM SUBSTRATE AND PROCESS FOR PRODUCTION THEREOF

[75] Inventor: Kazuaki Satoh, Tokyo, Japan

[73] Assignee: Fujitsu Limited, Kawasaki, Japan

[21] Appl. No.: 08/460,896

[22] Filed: Jun. 5, 1995

Related U.S. Application Data

[60] Continuation of application No. 08/046,148, Apr. 15, 1993, abandoned, which is a division of application No. 07/770,830, Oct. 4, 1991, abandoned.

[30] Foreign Application Priority Data

Oct. 5, 1990 [JP] Japan ..................................... 2-266489

[51] Int. Cl.⁶ .................................................... C09J 11/04
[52] U.S. Cl. .................. 156/331.5; 428/331; 428/355 R
[58] Field of Search .................. 156/327, 331.5; 428/447, 448, 473.5, 331, 353, 354, 355 R; 427/96

[56] References Cited

U.S. PATENT DOCUMENTS

| | | | |
|---|---|---|---|
| 3,951,902 | 4/1976 | Jones | 524/430 |
| 4,172,907 | 10/1979 | Mones | 437/231 |
| 4,271,074 | 6/1981 | Lohmann et al. | |
| 4,543,295 | 9/1985 | St. Clair et al. | |
| 4,792,476 | 12/1988 | Numata | 428/209 |
| 4,795,680 | 1/1989 | Rich | 428/450 |
| 4,897,153 | 1/1990 | Cole | 156/644 |
| 4,933,045 | 6/1990 | Di Stefano | 156/644 |
| 4,937,133 | 6/1990 | Watanabe | 428/209 |
| 4,959,437 | 9/1990 | Kunimune | 427/387 |
| 4,995,941 | 2/1991 | Nelson | 156/644 |
| 5,115,090 | 5/1992 | Sachdev | 528/353 |
| 5,118,385 | 6/1992 | Kumar | 156/644 |
| 5,135,595 | 8/1992 | Acocella | 156/89 |
| 5,178,962 | 1/1993 | Miyamoto | 428/463 |
| 5,207,865 | 5/1993 | Satoh | 156/644 |

Primary Examiner—Daniel Stemmer
Attorney, Agent, or Firm—Nikaido, Marmelstein, Murray & Oram LLP

[57] ABSTRACT

A multi-layer film substrate comprising at least two laminated insulating layers composed of a polyimide having a low thermal expansion, wherein an adhesion layer composed of an Si-containing or $SiO_2$-dispersed polyimide is interposed between the low thermal expansion polyimide layers. The substrate is produced by laminating at least two insulating layers composed of a polyimide having a low thermal expansion, wherein the low thermal expansion polyimide layers are laminated through an adhesion layer composed of an Si-containing or $SiO_2$-dispersed polyimide.

2 Claims, 5 Drawing Sheets

Fig. 1
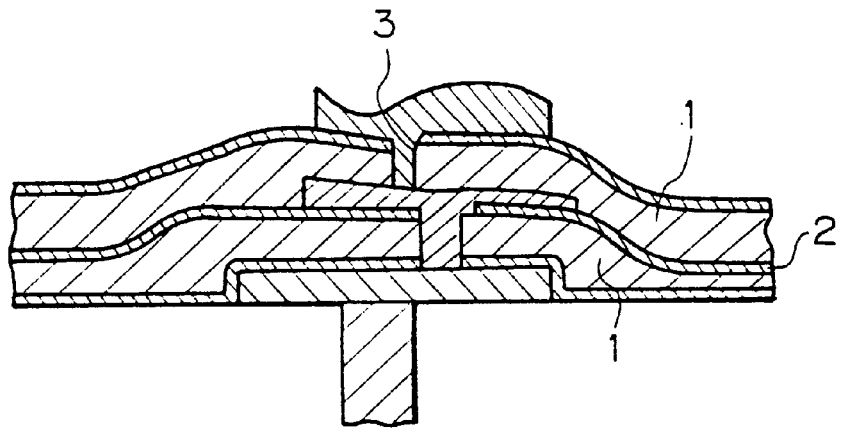
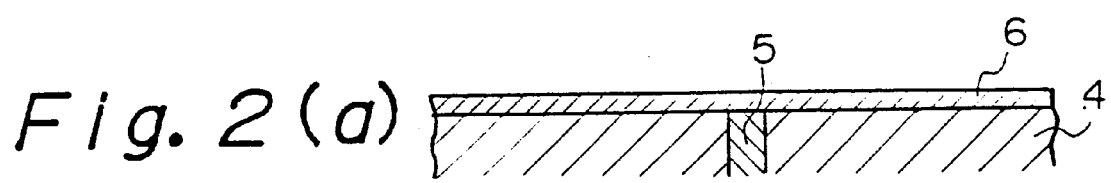
Fig. 2(a)
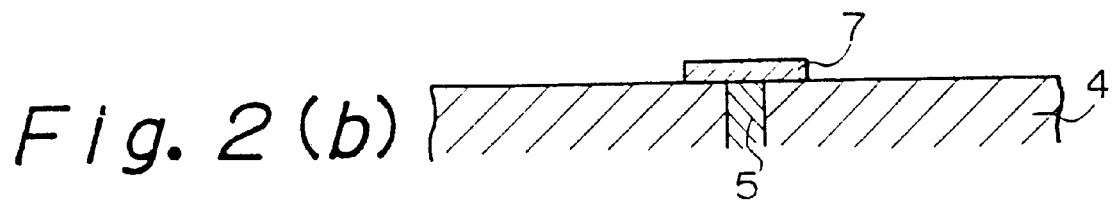
Fig. 2(b)
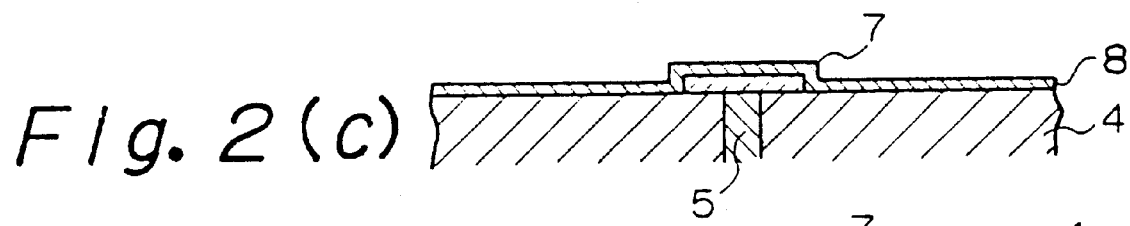
Fig. 2(c)
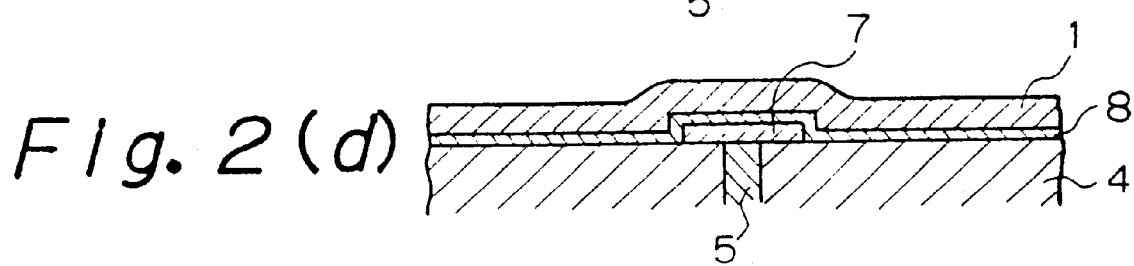
Fig. 2(d)

MULTI-LAYER FILM SUBSTRATE AND PROCESS FOR PRODUCTION THEREOF

This application is a continuation of application Ser. No. 08/046,148 filed Apr. 15, 1993, now abandoned, which is a divisional of Ser. No. 07/770,830 filed on Oct. 4, 1991, now abandoned.

BACKGROUND OF THE INVENTION

1. Field of the Invention

The present invention relates to a multi-layer film substrate and a process for the production thereof. More particularly, the present invention relates to a multi-layer film substrate comprising an insulating layer composed of a polyimide having a low thermal expansion, and a process for the production thereof.

2. Description of the Related Art

In the production of a multi-layer film printed layer, a polyimide is generally used as an insulating interlayer. This polyimide is formed by polymerization of an acid anhydride and a diamine, and a process in which a photosensitive group is given to the polyimide and the polyimide is processed by light exposure and development, a process in which the polyimide in the half-imide state is dissolved in a resist liquid developer, and a process in which a polyimidized film is processed by RIE (reactive ion etching) using a mask of $SiO_2$ or the like, have been adopted.

Nevertheless, this polyimide has a large thermal expansion, and at the polyimidization termination point, a tensile stress of 3.5 to 4.5 $kg/mm^2$ is imposed on the substrate, and therefore, the polyimide is defective in that, since the substrate is influenced by the tensile stress whereby a film printed pattern is damaged, the number of layers that can be laminated is limited.

Under these circumstances, there is an urgent need in the art for the provision of a multi-layer film substrate wherein the number of layers can be increased.

As the multi-layer film substrate in which the thermal expansion is reduced and an interfacial peeling is prevented, there has been proposed a multi-layer film substrate in which a polyimide having a small thermal expansion coefficient is used as the insulating layer.

In this multi-layer film substrate comprising an insulating layer of a low thermal expansion type polyimide, since the molecular structure of the polyimide is a rigid linear structure, molecule chains arranged in parallel form mica-like bonds. Therefore, this polyimide is defective in that the adhesion is extremely poor.

SUMMARY OF THE INVENTION

An object of the present invention is to overcome the above-mentioned defects by providing an insulating layer composed of a polyimide having a low thermal expansion and having a strong adhesion between the insulating layers, and a process for the production of this substrate.

In accordance with the present invention, this object can be attained by a multi-layer film substrate comprising at least two laminated insulating layers composed of a polyimide having a low thermal expansion, wherein an adhesion layer composed of an Si-containing or $SiO_2$-dispersed polyimide is interposed between the low thermal expansion polyimide layers.

Furthermore, in accordance with the present invention, there is provided a process for the production of a multi-layer film substrate, comprising laminating at least two insulating layers composed of a polyimide having a low thermal expansion, wherein the low thermal expansion polyimide layers are laminated through an adhesion layer composed of an Si-containing or $SiO_2$-dispersed polyimide.

BRIEF DESCRIPTION OF THE DRAWINGS

FIG. 1 is a sectional diagram showing an example of the multi-layer film substrate of the present invention;

DESCRIPTION OF THE PREFERRED EMBODIMENTS

Figure 2E:
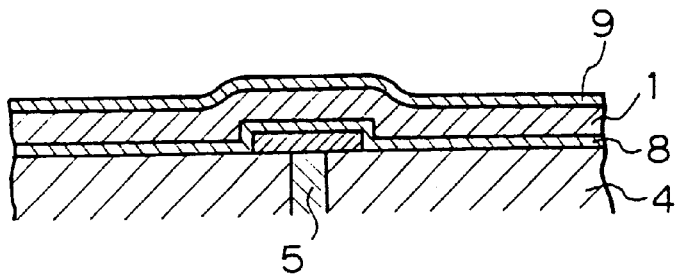
FIGS. 2(a) through 2(k) are diagrams showing an example of the process for the production of a multi-layer film substrate according to the present invention.

It is known that a low thermal expansion polyimide has a practically applicable adhesion to $SiO_2$, and that the adhesion is thereof reliable.

It is obvious that the polyimide/polyimide adhesion can not be improved unless the molecule structure is made rigid, i.e., this adhesion can not be improved without sacrificing the low thermal expansion characteristic. Therefore, as a means of improving the adhesion while maintaining the low thermal expansion characteristic, there can be considered a method in which the surface is roughened by a plasma treatment or the like, to enhance the physical adsorption. Nevertheless, no substantial effect can be expected from this process, and a problem of an increase of the conductor resistance due to a roughening of the surface arises.

Therefore, according to the present invention as shown in FIG. 1, an adhesion layer 2 comprising a binding hand of Si is interposed between layers 1 composed of a polyimide having a low thermal expansion, and Si in the adhesion layer is bound to C=O of the molecule chain of the low thermal expansion polyimide, whereby the adhesion between the low thermal expansion polyimide layer 1 is improved. The binding hand of Si can be provided by decomposing —$CH_2$—Si—$CH_2$— in the Si-containing polyimide molecule by heating, or from $SiO_2$ dispersed in the polyimide. Preferably, the polyimide constituting the adhesion layer is photo-sensitive.

As a source of $SiO_2$, there may be useful, for example, silica powders of average particle sizes of 0.29 μm, 0.49 μm and 0.83 μm, sold by Nippon Steel Chemical Co., Ltd. under the trademarks M-2003, M-2005 and M-2008.

The adhesion layer is then light-exposed and developed to form a hole 3, and thereafter, the low thermal expansion polyimide layer 1 can be etched by plasma ion etching while using the remaining part of the adhesion layer 2 as a mask.

In this case, there is utilized the phenomenon that the etching speed of the Si-containing adhesion layer 2 at RIE using $O_2$ gas is about 5 times as low as the etching speed of the low thermal expansion polyimide. Namely, if the adhesion layer 2 having the hole 3 formed by the light exposure and development is subjected to ion etching, the remaining part of the adhesion layer 2 acts as a mask and only the low thermal polyimide layer 1 defining the bottom of the hole 3 is selectively etched.

Accordingly, the present invention is advantageous compared to the conventional RIE using a Cu or $SiO_2$ layer as a mask, in that the occurrence of problems caused by an etching of an unnecessary part through pinholes formed in the mask per se, such as an insufficient interlaminar insulation and the formation of a short circuit, are prevented.

Preferred embodiments of the present invention will now be described with reference to the accompanying drawings.

FIG. 2 illustrates one embodiment of the present invention, in which reference numeral 4 represents a substrate such as a ceramic substrate having a plurality of thick film printed layers as inner layers, and reference numeral 5 represents a via to be led from the inner layer to the surface layer of the substrate 4.

First, as shown in FIG. 2 (a), a layer 6 of a conductive metal such as Ti or Al is formed on the substrate 4 by sputtering, this conductive metal layer 6 is etched and patterned to form a via land 7, an $SiO_2$ layer 8 is formed by sputtering, and the low thermal expansion polyimide 1 is coated and is half-imidized, and then a photosensitive Si-containing polyimide 9 is deposited [see FIGS. 2(b) through 2(e)]. Preferably, the photosensitive Si-containing polyimide 9 is coated to a thickness of about 10 µm, so that the polyimide 9 retains an adhesiveness to the next low thermal expansion polyimide even after the RIE etching step described hereinbelow, and is left with a thickness not generating a large residual stress, i.e., a thickness of 4 µm, to form an adhesion layer 2.

Note, the adhesion layer 2 can be also formed by coating a polyimide formed by incorporating about 30 to about 50% of a solution containing 20 to 30% of $SiO_2$ in an NMP (N-methyl-2-pyrrolidone) solvent in a photosensitive polyimide, as the adhesion layer 2 instead of the photosensitive Si-containing polyimide 9.

Figure 2F:
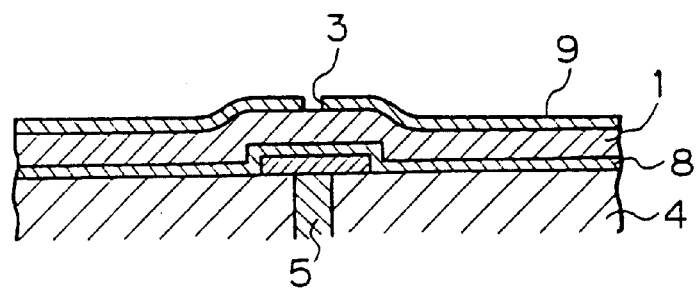

Then, as shown in FIG. 2(f), the photosensitive Si-containing polyimide 9 is light-exposed and developed to form a hole 3, a two-kind integral complete imidization baking is performed, and an RIE etching with $O_2$ gas is conducted, whereby the surface portion of the photosensitive Si-containing polyimide 9 is slightly etched and is left as the adhesion layer 2, and the low thermal expansion polyimide layer 1 is selectively etched to form a via hole 10. Then a sputtering layer 11 of Cr, Ti or Cu is formed on the surface layer, a resist 12 is deposited, and Cu, Ni or Au is deposited and etching is carried out to form a via hole 5' and a via land 7 [see FIGS. 2(h) through 2(j)]. A multi-layer film structure is formed by repeating the above-mentioned steps.

According to the preferred embodiment described above, if the polyimide layer 9 is photosensitive, the via hole 10 is formed after the formation of hole 3. Note, the polyimide layer need not be photosensitive. An example of the process of forming the hole 3 and the via hole 10 in this case will now be described with reference to FIG. 3.

Figure 2G:
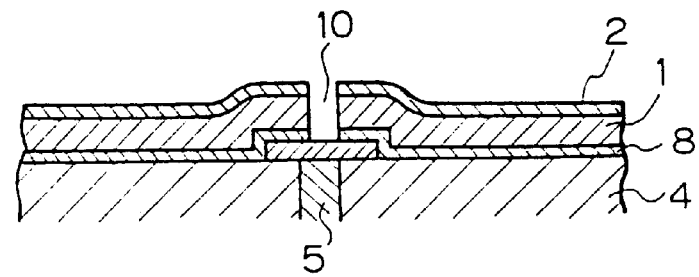
Figure 2H:
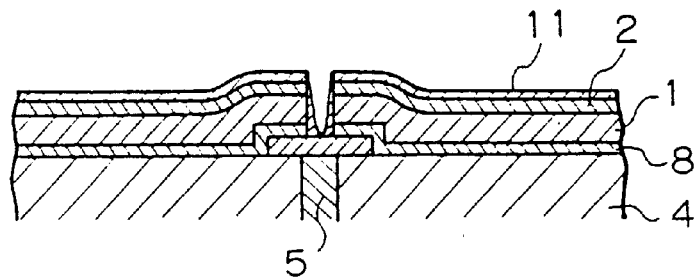
Figure 2L:
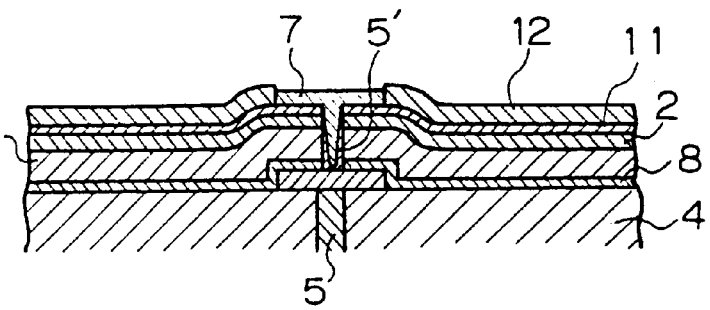
Figure 2J:
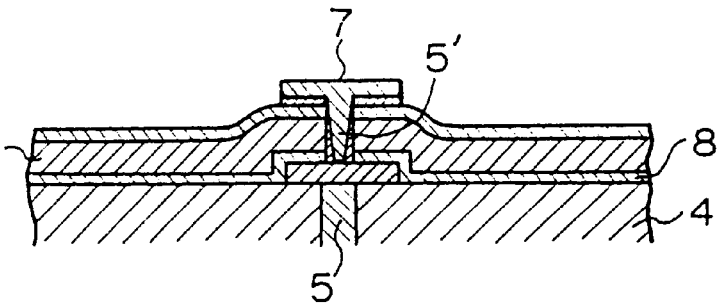
Figure 2K:
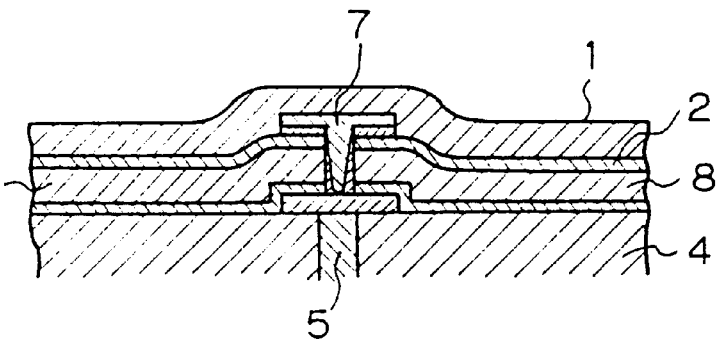
Figure 3A:
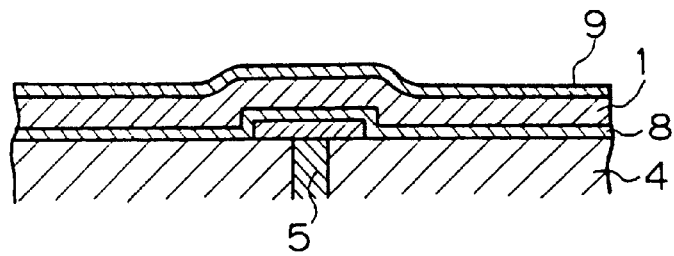
FIGS. 3(a) through 3(f) are diagrams illustrating another example of the process for the production of a multi-layer film substrate according to the present invention.
Figure 3B:
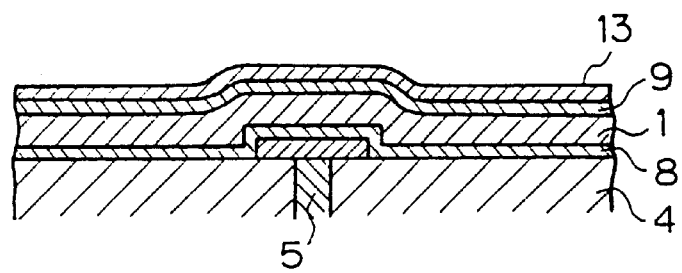
Figure 3C:
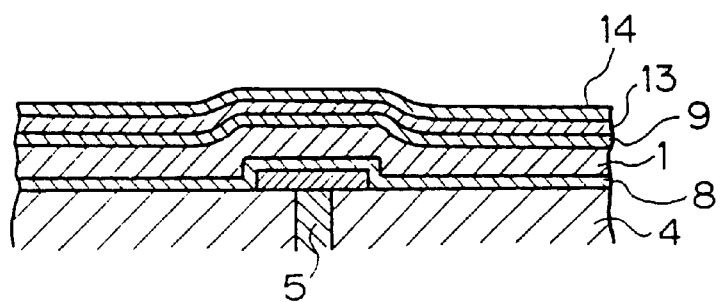
Figure 3D:
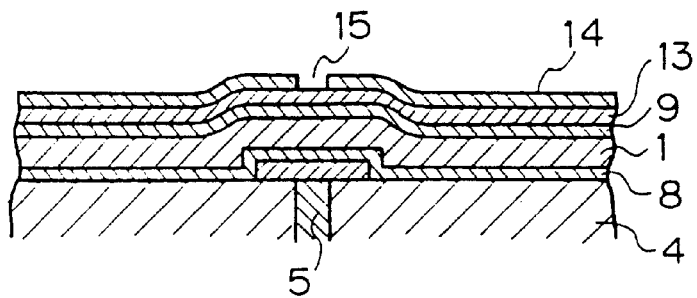
Figure 3E:
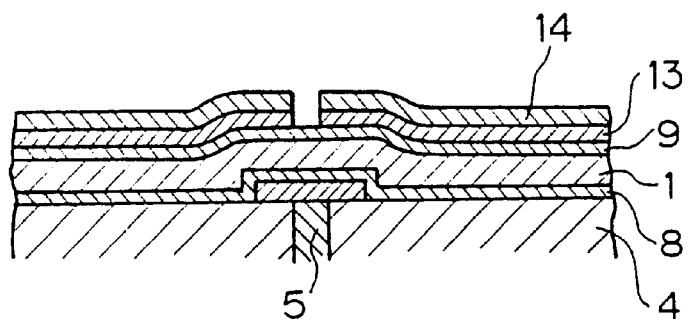
Figure 3F:
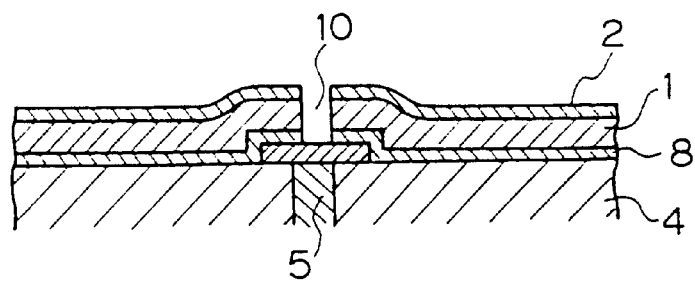

As shown in FIG. 3(a) corresponding to FIG. 2(e), the same operations as illustrated in the above-mentioned FIGS. 2(a) through 2(e) are conducted, to form an Si-containing or $SiO_2$-dispersed layer 9 and layers located below the layer 9. Then a metal layer 13 of Cr or Cu is formed on the polyimide layer 9 by sputtering [see FIG. 3(b)], and thereafter a resist layer 14 is coated on the metal layer 13 and dried [see FIG. 3(c)], and is light-exposed through a mask (not shown) and developed to form a hole 15 [see FIG. 3(d)]. Then the metal layer 13 is etched by ion milling or wet etching [see FIG. 3(e)], and subsequently, the polyimide layer 9 and the low thermal expansion polyimide layer 1 etched by wet etching or RIE etching to form a via hole 10, and the resist layer 14 and the metal layer 13 peeled according to customary procedures [see FIG. 3(f)]. Thus, a state shown in FIG. 2(g) is attained whereby a multi-layer film structure is formed.

According to the process illustrated above, a substrate having a high adhesion between insulating layers can be obtained.

Furthermore, when the adhesion layer is utilized as a mask at the RIE step, the process of the present invention is advantageous when compared to the conventional RIE process using a Cu or $SiO_2$ layer as a mask, in that problems caused by an etching of an unnecessary part due to formation of pinholes in the mask per se, such as an insufficient interlaminar insulation and a formation of a short circuit, can be prevented.

I claim:

1. A process for the production of a multilayer film comprising:

forming a conductive pattern on a substrate; and then laminating together said substrate and at least two insulating layers, each of said at least two insulating layers being composed of a polyimide having a low thermal expansion, said two insulating layers being bonded to each other through an adhesion layer composed of a polyimide having $SiO_2$ dispersed therein, wherein the adhesion layer is formed onto the layer of the polyimide having a low thermal expansion after the layer of the polyimide having a low thermal expansion is formed.

2. A process according to claim 1, wherein the layer of the polyimide having $SiO_2$ dispersed therein is photosensitive and is light-exposed in a pattern and developed.

\* \* \* \* \*